United States Patent
Varnica et al.

(10) Patent No.: US 9,385,753 B2
(45) Date of Patent: Jul. 5, 2016

(54) SYSTEMS AND METHODS FOR BIT FLIPPING DECODING WITH RELIABILITY INPUTS

(71) Applicant: Marvell World Trade Ltd., St. Michael (BB)

(72) Inventors: Nedeljko Varnica, San Jose, CA (US); Dung Viet Nguyen, San Jose, CA (US); Shashi Kiran Chilappagari, San Jose, CA (US)

(73) Assignee: Marvell World Trade Ltd., St. Michael (BB)

(*) Notice: Subject to any disclaimer, the term of this patent is extended or adjusted under 35 U.S.C. 154(b) by 188 days.

(21) Appl. No.: 14/172,420

(22) Filed: Feb. 4, 2014

(65) Prior Publication Data
US 2014/0229792 A1 Aug. 14, 2014

Related U.S. Application Data

(60) Provisional application No. 61/764,901, filed on Feb. 14, 2013.

(51) Int. Cl.
H03M 13/00 (2006.01)
H03M 13/11 (2006.01)

(52) U.S. Cl.
CPC ...... H03M 13/1108 (2013.01); H03M 13/1137 (2013.01); H03M 13/1171 (2013.01)

(58) Field of Classification Search
CPC .................. H03M 13/1108; H03M 13/1137; H03M 13/1171
USPC ........................................................... 714/759
See application file for complete search history.

(56) References Cited

U.S. PATENT DOCUMENTS

| | | |
|---|---|---|
| 8,312,354 B1 | 11/2012 | Varnica et al. |
| 8,443,267 B2 | 5/2013 | Zhong et al. |
| 8,495,453 B1 | 7/2013 | Varnica et al. |
| 8,694,868 B1 | 4/2014 | Chilappagari et al. |
| 8,819,530 B1 | 8/2014 | Yeo et al. |
| 8,862,970 B1 | 10/2014 | Varnica et al. |
| 8,910,028 B1 | 12/2014 | Li et al. |
| 8,930,797 B2 | 1/2015 | Haratsch |
| 8,938,660 B1 | 1/2015 | Varnica et al. |
| 8,984,378 B1 | 3/2015 | Chilappagari et al. |
| 9,003,267 B2 | 4/2015 | Varnica et al. |

(Continued)

FOREIGN PATENT DOCUMENTS

WO WO-2009072103 A2 6/2009

OTHER PUBLICATIONS

"VLSI Implementation of a High-Throughput Soft-Bit-Flipping Decoder for Geometric LDPC Codes", Junho Cho et al, IEEE Transactions on Circuits and Systems I: Regular Papers 57:5, May 1, 2010, pp. 1083-1094.

(Continued)

*Primary Examiner* — David Ton

(57) ABSTRACT

Systems and methods are provided for decoding data. A decoder receives a variable node value and reliability data for a variable node, and check node values for check nodes associated with the variable node. Circuitry generates an updated variable node value, based on the received reliability data and the received check node values. The circuitry also generates, for at least one check node, an updated check node value based on the updated variable node value.

20 Claims, 13 Drawing Sheets

(56) References Cited

U.S. PATENT DOCUMENTS

| | | | |
|---|---|---|---|
| 9,009,578 B1 | 4/2015 | Varnica | |
| 9,065,484 B2* | 6/2015 | Sandberg | H03M 13/13 |
| 9,083,383 B1* | 7/2015 | Tunali | H03M 13/13 |
| 2005/0166129 A1 | 7/2005 | Yano et al. | |
| 2006/0190797 A1 | 8/2006 | Xin | |
| 2009/0177931 A1 | 7/2009 | Song et al. | |
| 2009/0234792 A1 | 9/2009 | Kim et al. | |
| 2010/0037121 A1* | 2/2010 | Jin | H03M 13/1117 714/763 |
| 2010/0077279 A1 | 3/2010 | Kim et al. | |
| 2010/0275096 A1 | 10/2010 | Zhong et al. | |
| 2011/0191653 A1 | 8/2011 | Zeng et al. | |
| 2011/0246849 A1* | 10/2011 | Rault | H03M 13/1128 714/752 |
| 2012/0079355 A1 | 3/2012 | Patapoutian et al. | |
| 2012/0224420 A1 | 9/2012 | Sakurada et al. | |
| 2012/0317462 A1* | 12/2012 | Liu | H03M 13/3753 714/780 |
| 2013/0073922 A1 | 3/2013 | Varnica et al. | |
| 2013/0173988 A1* | 7/2013 | Chen | H03M 13/1125 714/758 |
| 2014/0108883 A1* | 4/2014 | Tehrani | G06F 11/1012 714/758 |
| 2014/0164886 A1 | 6/2014 | Grieb et al. | |
| 2014/0245098 A1 | 8/2014 | Sharon et al. | |
| 2014/0289584 A1 | 9/2014 | Chilappagari et al. | |
| 2015/0169406 A1 | 6/2015 | Li et al. | |
| 2015/0220389 A1 | 8/2015 | Kim et al. | |

OTHER PUBLICATIONS

"An Improvement on the Modified Weighted Bit Flipping Decoding Algorithm for LDPC Codes", Ming Jiang et al, IEE Communications Letters 9:9, pp. 814-816.

International Search Report and Written Opinion issued Apr. 1, 2014 in International Application No. PCT/US2014/014697.

International Search Report and Written Opinion dated Aug. 7, 2014 in International Application No. PCT/US2014/020644.

International Search Report and Written Opinion dated Aug. 7, 2014 in International Application No. PCT/US2014/020775.

International Preliminary Report on Patentability and Written Opinion dated Sep. 17, 2015 in International Application No. PCT/US2014/020775.

* cited by examiner

| 300 | | | | |
|---|---|---|---|---|
| 310 — HARD DECISION FLIP VECTOR FOR UNRELIABLE NODES | $f_0(0,0)$ | $f_0(0,1)$ | ... | $f_0(0,d_v)$ |
| 320 — HARD DECISION FLIP VECTOR FOR RELIABLE NODES | $f_0(1,0)$ | $f_0(1,1)$ | ... | $f_0(1,d_v)$ |

| 350 | | | | |
|---|---|---|---|---|
| 360 — RELIABILITY FLIP VECTOR FOR UNRELIABLE NODES | $f_1(0,0)$ | $f_1(0,1)$ | ... | $f_1(0,d_v)$ |
| 370 — RELIABILITY FLIP VECTOR FOR RELIABLE NODES | $f_1(1,0)$ | $f_1(1,1)$ | ... | $f_1(1,d_v)$ |

| $x_1$ | 0 | 0 | 0 | ... | 0 | 0 | ... | 0 | 1 | ... | 1 | 2 | 2 | ... | 6 |
|---|---|---|---|---|---|---|---|---|---|---|---|---|---|---|---|
| $x_2$ | 0 | 0 | 0 | ... | 1 | 6 | ... | 0 | 0 | ... | 5 | 2 | 2 | ... | 0 |
| $x_3$ | 0 | 1 | 2 | ... | 1 | 0 | ... | 0 | 1 | ... | 0 | 0 | 1 | ... | 0 |
| $x_4$ | 6 | 5 | 4 | ... | 4 | 0 | ... | 5 | 4 | ... | 0 | 4 | 3 | ... | 0 |

| $x_1/x_2$ | 0 | 1 | 2 | ... | $d_v$ |
|---|---|---|---|---|---|
| 0 | | | | | |
| 1 | | | | | |
| 2 | | | | | |
| ... | | | | | |
| $d_v$ | | | | | |

| $x_1/x_2$ | 0 | 1 | 2 | 3 | 4 | 5 | 6 |
|---|---|---|---|---|---|---|---|
| 0 | 0 | 7 | 13 | 18 | 22 | 25 | 27 |
| 1 | 28 | 34 | 39 | 43 | 46 | 48 | |
| 2 | 49 | 54 | 58 | 61 | 63 | | |
| 3 | 64 | 68 | 71 | 73 | | | |
| 4 | 74 | 77 | 79 | | | | |
| 5 | 80 | 82 | | | | | |
| 6 | 83 | | | | | | |

FIG. 9C

SYSTEMS AND METHODS FOR BIT FLIPPING DECODING WITH RELIABILITY INPUTS

CROSS REFERENCE TO RELATED APPLICATIONS

This disclosure claims the benefit under 35 U.S.C. §119(e) of U.S. Provisional Application No. 61/764,901, filed on Feb. 14, 2013, which is incorporated herein by reference in its entirety.

FIELD OF USE

This disclosure relates generally to data decoding, and more particularly to hard decoders with reliability inputs for data encoded with a low density parity check (LDPC) encoder.

BACKGROUND

LDPC codes and decoders that are used to decode LDPC codes may be used in numerous applications and devices. For example, data storage, satellite communications, wireless communications, wire-line communications, and power-line communications are applications that may each use LDPC codes and LDPC decoders. Devices such as digital camera flash memory storage, satellites, mobile phones, and other mobile devices may also each use LDPC codes and LDPC decoders.

LDPC codes may be used for correcting errors in information transmitted in a noisy data storage or communications channel. The information may be encoded (by a LDPC encoder) prior to transmission and then subsequently decoded (by a LDPC decoder) when received. LDPC codes are one of the best performing error correction codes, along with Turbo codes, for use in correcting errors in information transmitted on communication and data storage channels.

Conventional hard decoding LDPC techniques typically determine whether to flip a bit or update the value of a symbol based only on whether a given number of checks are unsatisfied. For example, values of one or more symbols may be selected to be updated based on which combination of updated symbols is most likely to reduce the number of unsatisfied check nodes.

SUMMARY

In accordance with an implementation of the disclosure, systems and methods are provided for decoding data. A decoder receives a variable node value and reliability data for a variable node, and check node values for check nodes associated with the variable node. Circuitry generates an updated variable node value, based on the received reliability data and the received check node values. The circuitry also generates, for at least one check node, an updated check node value based on the updated variable node value.

The circuitry determines whether updated check node values for the at least one check node satisfy a decoding convergence condition. The updated variable node value is further based on a number of check nodes associated with the variable node that have a given received check node value. The updated variable node value is further based on whether the number of check nodes having the given received check node value exceeds a predetermined threshold.

In some implementations, generating the updated variable node value includes using a lookup table. In response to determining that the updated variable node value is different from a previous value of the variable node value, the circuitry may store the updated variable node value in memory. In some implementations, generating the updated check node value for at least one check node is in response to determining that the updated variable node value is different from a previous value of the variable node value. The circuitry may generate updated reliability data for the variable node, based on the received reliability data and received check node values. In some implementations, check reliability data for check nodes associated with the variable node is received. The updated variable node value is further based on the received check reliability data. The circuitry processes, for at least one check node, check reliability data for the check node, based on the received reliability data, the received check node values, and the received check reliability data.

In accordance with an implementation of the disclosure, a decoder comprises decoding circuitry communicatively coupled to a memory. The decoding circuitry is configured to receive a variable node value and reliability data for a variable node, and check node values for check nodes associated with the variable node, and generate an updated variable node value, based on the received reliability data and the received check node values. The decoding circuitry is further configured to generate, for at least one check node, an updated check node value based on the updated variable node value.

BRIEF DESCRIPTION OF THE DRAWINGS

The above and other features of the present disclosure, including its nature and its various advantages, will be more apparent upon consideration of the following detailed description, taken in conjunction with the accompanying drawings in which:

FIG. 3 shows lookup tables used for implementing rules for updating variable node values and variable node reliability data, in accordance with an embodiment of the present disclosure;

FIG. 9A is a table of lexicographically ordered tuples, in accordance with an embodiment of the present disclosure;

FIG. 9B is a lookup table setup of check node combinations, in accordance with an embodiment of the present disclosure;

FIG. 9C is a lookup table of check node combinations for tuples, in accordance with an embodiment of the present disclosure;

DETAILED DESCRIPTION

This disclosure generally relates to performing decoding at a decoder. To provide an overall understanding of the disclosure, certain illustrative embodiments will now be described, including a decoder that decodes a codeword by updating symbol values in multiple iterations. However, it will be understood by one of ordinary skill in the art that the systems and methods described herein may be adapted and modified as is appropriate for the application being addressed, and that the systems and methods described herein may be employed in other suitable applications, and that such other additions and modifications will not depart from the scope thereof.

Figure 1:
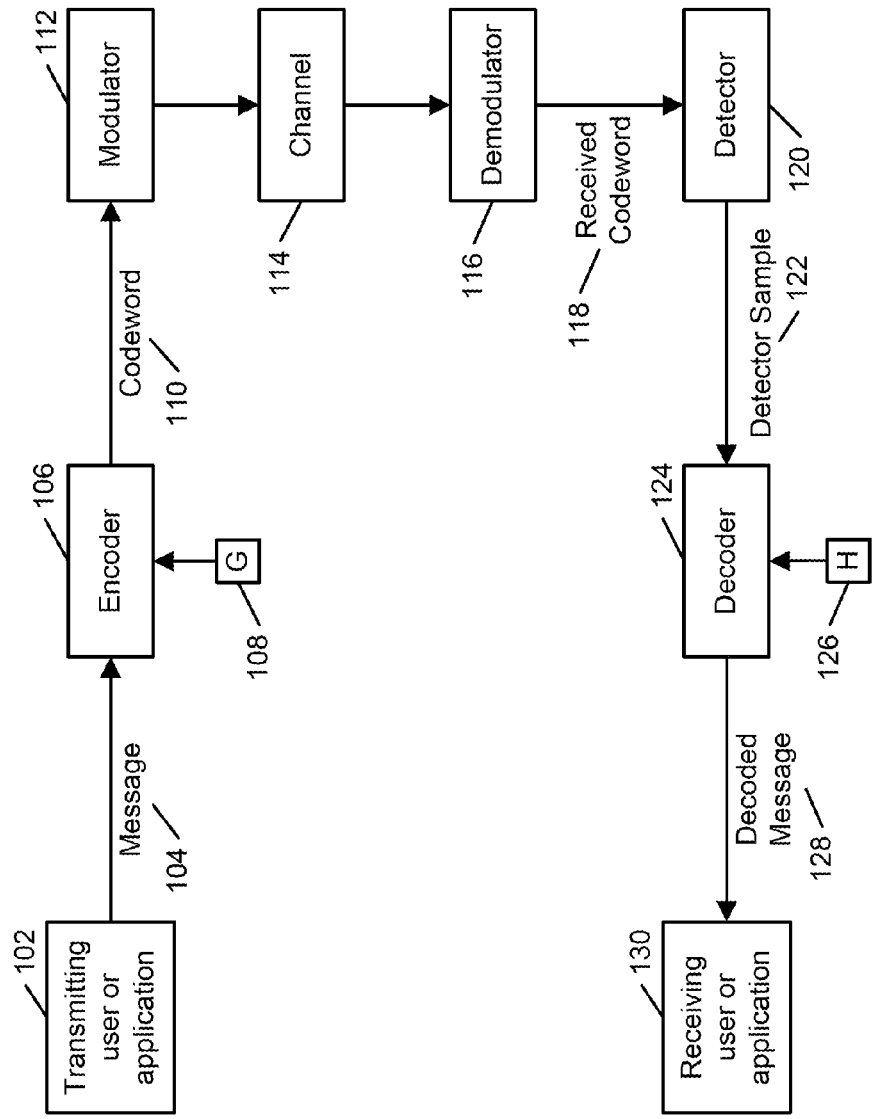
FIG. 1 is a block diagram of an illustrative communications system employing LDPC decoding, in accordance with an embodiment of the present disclosure.

FIG. 1 shows an illustrative communications system 100 for LDPC decoding based, in part, on reliability inputs, in accordance with some embodiments of the present disclosure. A communications system 100 is used to transmit information from a transmitting user or application 102 to a receiving user or application 130. The transmitting user or application 102 represents an object or entity that produces information. For example, the transmitting user or application 102 may correspond to a software program in a computer system or to a component of a wireless communications transmitter in a radio system. The transmitting user or application 102 produces information in the form of a data stream, and the data stream may be represented by a sequence of symbol values that have been pre-processed by, for example, a source encoder (not shown in FIG. 1). The information produced by the transmitting user or application 102 may correspond to voice information, video information, financial information, or any other type of information that may be represented in digital or analog form, and the data stream produced by transmitting user or application 102 may be a digital data stream.

The transmitting user or application 102 may segment or otherwise divide the data stream into blocks of a fixed length of k symbols. In particular, a message 104, also referred to as m, represents one of these blocks. In particular, the message 104 is k symbols in length, where each symbol may be binary data or non-binary data such as ternary data, quaternary data, any other suitable type of data, or any suitable combination thereof. An encoder 106 is used to encode the message 104 to produce a codeword 110. In one embodiment of the present disclosure, the encoder 106 is an LDPC encoder. However, based on the disclosure and teachings provided herein, it should be clear that the encoder 106 may be any other suitable encoder. The codeword 110, also referred to as c, has a length of n symbols, where n>k. The encoder 106 uses a generator matrix G 108, also referred to as G for notational convenience, to produce the codeword 110. For example, the encoder 106 may perform one or more matrix operations to convert the message 104 into the codeword 110. In an embodiment, the encoder 106 produces the codeword 110 from the message 104 using the generator matrix G 108 by the following matrix multiplication $$\underline{c} = G \underline{m}.$$

The codeword 110 may be modulated or otherwise transformed by a modulator 112 into a waveform suitable for transmission and/or storage on a channel 114. For example, the waveform may correspond to an analog Binary Phase-Shift Keying (BPSK) signal, analog Phase-Shift Keying (PSK) signal, analog Frequency-Shift Keying (FSK) signal, analog Quadrature Amplitude Modulation (QAM) signal, or any other suitable analog or digital signal.

The channel 114 refers to the physical medium through which the transmitted waveform passes, or is stored on, before being recovered at a demodulator 116. For example, the channel 114 may be a storage channel that represents a storage medium in a computer system environment, or a communications channel that represents the wireless propagation environment in a wireless communications environment. Various characteristics of the channel 114 may corrupt data that is communicated or stored thereon. For example, the channel 114 may be a non-ideal memoryless channel or a channel with memory; the channel 114 may be an erasure channel, and may be symmetric or asymmetric. The output of the channel 114 is demodulated and processed by the demodulator 116 to produce a received codeword 118. The demodulator 116 may use frequency filters, multiplication and integration by periodic functions, and/or any other suitable demodulation technique to demodulate and/or process the output of the channel 114.

The received codeword 118 contains information related to the codeword 110 and may be a corrupted or otherwise altered version of the codeword 110 originally output by the encoder 106. For example, the received codeword 118 may contain a preliminary estimate or noisy version of the codeword 110, a probability distribution vector of possible values of the codeword produced by the encoder 106, or combinations of these as well as other values.

A detector 120 is used to process the received codeword 118 to produce a detector sample 122, which may be an estimate of the original data message 104, also referred to herein as one or more hard decisions. The detector 120 samples each symbol in the received codeword 118 and assigns each symbol to a bin based on the symbol's value. In some embodiments, the bin is assigned based on a probability distribution. Each symbol sampled by the detector 120 may be assigned to one of two or more possible bins, or states. The states that are determined for the detector sample 122 are stored in memory as the sample codeword. This memory is termed the "hard decision memory," which may be in a different memory location from the received codeword 118.

In some embodiments, the channel 114 is read multiple times, and the multiple reads may be processed jointly or separately by the demodulator 116, the detector 120, or both to generate reliability data in addition to the hard decision sample codeword. For example, to determine the input state of a given symbol stored in a flash memory storage device, the memory cell in which the received value of the symbol is stored may be read more than once. Multiple reads of the channel 114 corresponding to the same symbol may be processed by the detector 120 to generate detector sample 122 in the form of reliability data and hard decision data. For example, in a binary code, multiple reads of the channel 114 may be processed by the demodulator 116, the detector 118, or both to generate one bit of hard decision data and one bit of reliability data for each bit in the sample codeword. In another example, two bits of reliability data may be generated for each bit in the sample codeword. Such reliability data may be stored in a "reliability data memory" location that is separate from the hard decision memory, or may be stored together with the hard decisions in the same memory location. Both hard decision and reliability data in the form of detector sample 122 are transmitted to a decoder 124 as input for subsequent decoding operations.

The decoder 124 receives and iteratively processes the detector sample 122. The detector 120 and the decoder 124 may be two separate processors, or a single processor may be used as both the detector 120 and decoder 124. In general, the decoder 124 comprises control circuitry and/or decoding circuitry used to iteratively correct and/or detect errors present in the detector sample 122, for example, due to transmission through the channel 114. In some embodiments, the decoder 124 uses the parity check matrix H 126 and a decoding technique to produce a decoded message 128. In general, LDPC decoding can be described using a mathematical vector model $Hc=\vec{0}$, in which c is a binary string of length n and H is the parity check matrix H 126, which is a low-density, sparse n×m matrix, wherein, as above, n is the number of symbols in the codeword, m is the number of check nodes satisfying and m≥n−k, and k is the number of symbols in the message. The model is satisfied only when the binary string c is the codeword $\underline{c}$ 110. The parity check matrix H 126 is not necessarily unique, and may be chosen to be computationally convenient, to decrease the number of errors generated by the decoding technique of the decoder 124, or both.

In accordance with the present disclosure, the iterative decoding technique used by the decoder 124 involves processing detector samples 122 by updating symbols, reliability data, or both based on one or more "update rules." In an example, an update rule may be based on whether checks of the symbol are satisfied or unsatisfied, whether the symbol has been previously updated, flipped, or toggled, based on the value of the reliability data, or a suitable combination thereof. Generally, as used herein, "flipping" or "toggling" a symbol means to update a value of the symbol to a different value than the current value. Unlike conventional bit flipping decoders of LDPC codes that typically work on hard decision inputs only, bit flipping decoders with reliability inputs as discussed herein may improve the performance of the decoder, reduce the total number of decoding iterations required to reach convergence, or both.

After processing, each symbol in the decoded message 128 should be assigned as one state in a set of possible states. When input into the model $Hc=\vec{0}$ as c, the decoded message 128 satisfies the model. Suitable systems and processes for performing decoding are described in relation to FIGS. 3-13.

The decoded message 128 is delivered to the receiving user or application 130 after being processed by the decoder 124. The receiving user or application 130 may correspond to the same device or entity as the transmitting user or application 102, or the receiving user or application 130 may correspond to a different device or entity. Further, the receiving user or application 130 may be either co-located or physically separated from the transmitting user or application 102. If the decoder 124 corrects all errors that are induced by the channel 114 and other communications effects in the communications system 100, then the decoded message 128 is a logical replica of the message 104. Otherwise, the decoded message 128 may differ from the message 104, and the decoder 124 may declare an error accordingly.

Figure 2B:
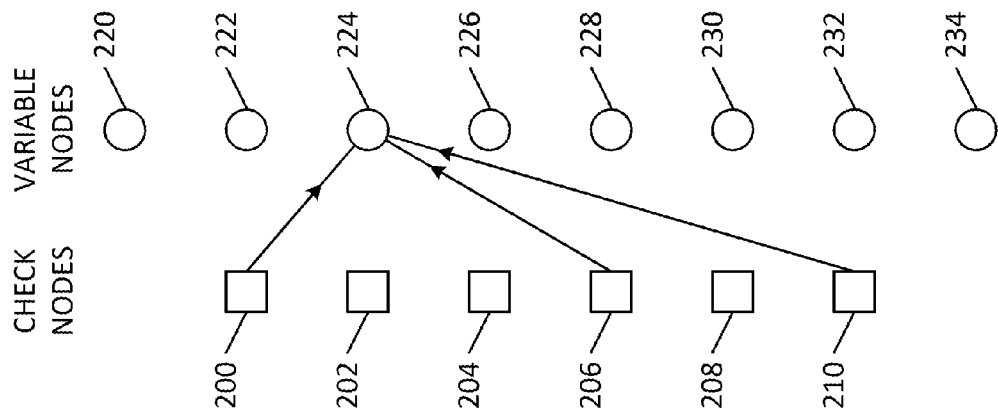
FIGS. 2A and 2B are graphical illustrations of communications between variable nodes representing symbols of a received codeword and check nodes for decoding the received codeword, in accordance with an embodiment of the present disclosure.
Figure 2A:
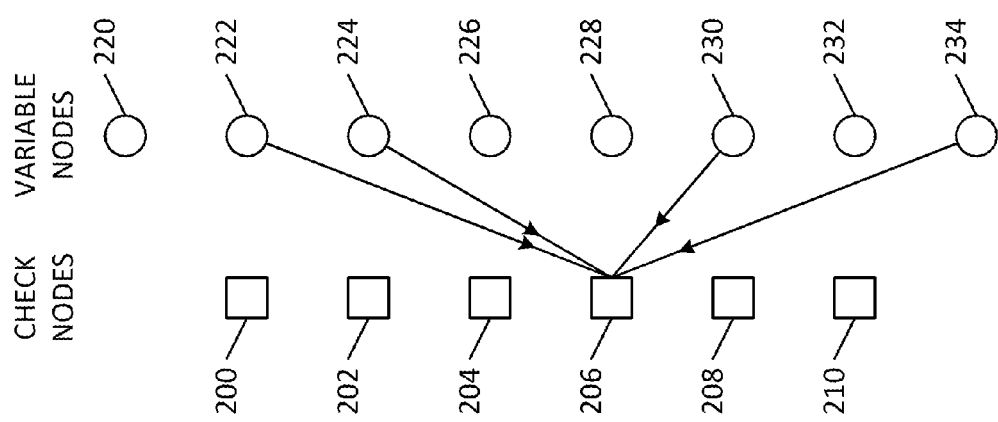

FIGS. 2A and 2B are graphical illustrations of communications between variable nodes 220-234 representing an example codeword and check nodes 200-210 for decoding the codeword using variable reliability information, in accordance with an embodiment of the present disclosure.

Upon initialization of the decoding process, variable nodes 220-234 are assigned input states using the detector 120 as described in relation to FIG. 1, where both hard decision and reliability information are taken into account. As discussed herein, a "variable value" refers to the hard decision associated with a variable node, while "variable reliability data" refers to the reliability data associated with the variable node or variable value. An input state may include one or both of the variable value and the variable reliability data.

In one illustrative example, every variable node is associated with a two-bit input denoted by $[b_1\ b_0]$, where the value of the bit $b_0$ indicates the hard decision and the value of the bit $b_1$ indicates the reliability of the hard decision. In a binary code, $b_0$ may take on values 0 or 1, representing the two possible hard decision states of a decoded bit. Correspondingly, $b_1$ may also take on values 0 or 1, where 0 represents an unreliable hard decision, and 1 represents a reliable hard decision. In other words, an input of 10 to a variable node may be interpreted as a reliable decision of 0, an input of 00 to a variable node may be interpreted as an unreliable decision of 0, an input of 01 to a variable node may be interpreted as an unreliable decision of 1, and an input of 11 to a variable node may be interpreted as a reliable decision of 1. The hard decision and reliability data input may be stored together in one memory location as input states, or separately in a hard decision memory and a reliability data memory. As described herein, only one bit is used to represent the hard decision and only one bit is used to represent the reliability of the hard decision. However, in general, any number of bits may be used to represent the hard decision, the reliability, or both. In particular, the hard decision may take on more than two values for non-binary codes, and the reliability messages may carry one or more bits or symbols.

After the variable nodes 220-234 are assigned input states using the detector 120 as described in relation to FIG. 1, a check of the variable nodes is performed by the decoder 124 on a plurality of groups of variable nodes. The decoder 124 uses processing rules to determine a condition of a group of variable nodes. An indication of the determined condition is stored in syndrome memory at a check node, such as check nodes 200-210. The parity check matrix H 126 (FIG. 1) identifies which check nodes store indications of the determined conditions for which variable nodes. For example, for the nodes pictured in FIGS. 2A and 2B and for a binary code example, the parity check matrix H 126 may be as follows $$H = \begin{bmatrix} 1 & 0 & 1 & 0 & 1 & 1 & 0 & 0 \\ 0 & 1 & 0 & 1 & 0 & 1 & 1 & 0 \\ 1 & 0 & 0 & 1 & 1 & 0 & 1 & 0 \\ 0 & 1 & 1 & 0 & 0 & 1 & 0 & 1 \\ 0 & 1 & 0 & 0 & 1 & 0 & 1 & 1 \\ 1 & 0 & 1 & 1 & 0 & 0 & 0 & 1 \end{bmatrix}$$

Each row corresponds to one of the check nodes, and each column corresponds to one of the variable nodes. With binary codes, the elements of the parity check matrix are 0 or 1, as shown above. As used herein, a "neighboring" check node of a variable node is a check node that has a connection to the variable node. Similarly, a "neighboring" variable node of a check node is a variable node that has a connection to the check node. The parity check matrix H 126 shown above provides indications of the connections between check nodes and variable nodes. In particular, as shown in FIG. 2A, variable nodes 222, 224, 230, and 234 are neighbors of check node 206, and as shown in FIG. 2B, check nodes 200, 206, and 210 are neighbors of variable node 224. Furthermore, in binary codes, each check node has one of two states, 0 if the check is satisfied, and 1 if the check is unsatisfied. For a non-binary code, the elements of the parity check matrix are non-binary, and each check node has one of more than two states. Each row of the parity check matrix forms the coefficients of a parity check equation, which is computed in the non-binary domain. In some embodiments, each check node is further associated with one or more bits of check reliability data. For example, if the majority of variable nodes associated with a check node have unreliable variable values, the computed check node value may be flagged as unreliable. The reliability of the check node value may be represented by a corresponding single bit of check reliability data. In some embodiments, more than one bit of check reliability data is stored in a check reliability memory and updated through the decoding process. The check reliability memory may be implemented together with or separated from the syndrome memory. While check reliability data may improve the performance of the decoder, a system that uses check reliability data consumes more power than a system that does not use check reliability data. Thus, a trade-off between decoding performance and power consumption may be considered when determining whether to use check reliability data.

The decoder 124 references the parity check matrix H 126 to identify variable nodes associated with a particular check node, or variable nodes that should be checked by the particular check node. For example, for the check node 206, the decoder 124 uses fourth row of the parity check matrix H 126 to determine that that check node 206 stores the result of a check of variable nodes 222, 224, 230, and 234 (i.e., the second, third, sixth, and eighth variable nodes). Then, the decoder 124 retrieves the values stored in these variable nodes. The values in the fourth row of the above parity check matrix H are the coefficients of a parity check equation, which are each multiplied by the corresponding values of the variable nodes. For illustration, the arrows in FIG. 2A indicate that the retrieved values flow from the variable nodes 222, 224, 230, and 234 to the check node 206, and the check node 206 may be considered to "check" the variable nodes 222, 224, 230, and 234. The variable node values are retrieved by the decoder 124, which processes the values on behalf of the check node 206 according to the processing rules.

From the values received from the variable nodes 222, 224, 230, and 234, the decoder 124 determines whether a given condition for the check node 206 is satisfied or is unsatisfied. An indication of whether the check node 206 is satisfied or unsatisfied (i.e., the "syndrome value" or the "check node value" of the check node) is stored in syndrome memory, which stores syndrome values or indications of the check nodes. In addition, reliability of the syndrome values of the check nodes may be updated based on values and reliability of associated variable nodes.

After the indications or syndrome values for the check nodes 200-210 have been stored in the syndrome memory, the values of the variable nodes 220-234 may be updated based on the values of the check nodes and reliability of the variable nodes. The parity check matrix H 126 is again used by the decoder 124 to determine which check nodes should be accessed for a particular variable node. As illustrated in FIG. 2B, for updating the variable node 224, the parity check matrix H 126 given above indicates that check nodes 200, 206, and 210 (i.e., the first, fourth, and sixth check nodes) should be referenced. Based on the indications of the referenced check nodes, the state of the variable node 224 may be updated.

In some embodiments of the present disclosure, the value of the variable node 224 may also be determined based, in part, on whether the variable node 224 had previously been updated, toggled, or flipped, as described in relation with respect to FIGS. 3-13. The check nodes and variable nodes may be iteratively updated until all check nodes are satisfied (i.e., an all-zero syndrome is achieved) or until a maximum number of iterations has been reached. The output of the decoder 124 is the content of the hard-decision memory upon termination of the decoding process, or the decoded message 128.

In one example of binary variable node update based on single-bit reliability, the hard decision or variable node value of variable node i at the end of iteration j is denoted by $b_0(i,j)$, while the reliability data of variable node i at the end of iteration j is denoted by $b_1(i,j)$. For iterations where j>1, the relationship between the updated variable value $b_0(i,j)$ and the last variable value $b_0(i,j-1)$ may be represented by Eq. (1), where u(i,j) represents the total number of unsatisfied checks associated with variable node i, and $f_0$ represents a variable value update rule with an output value of 0 or 1, indicating whether the previous variable node value should be toggled or flipped.

$$b_0(i,j)=b_0(i,j-1)\oplus f_0(b_0(i,j-1),b_1(i,j-1),u(i,j)) \quad (1)$$

In some embodiments, the variable value update rule $f_0$ depends on the number of unsatisfied check nodes exceeding a predetermined threshold. In some embodiments, the variable value update rule $f_0$ depends on the pattern of unsatisfied check nodes. The variable value update rule $f_0$ may also be written as $f_{(0,j)}$, which may vary across different iterations j. The dependence of $f_{(0,j)}$ on the inputs of $f_{(0,j)}$ may vary during iterations that occur between initialization of the decoding process and convergence of the decoding process. For example, during an initial portion of the decoding process, a variable node may be updated only when a large number of associated check nodes are unsatisfied. After a number of iterations, the update rule may be changed such that the variable node is updated if any of the associated check nodes are unsatisfied. In some embodiments, an XOR operation is performed between the output value of the variable value update rule $f_0$ and the last variable node value to generate the updated variable node value. Alternatively, the variable value update rule $f_0$ may generate the updated variable value $b_0(i,j)$ directly.

In some embodiments, variable node reliability information is updated. In this case, the relationship between the updated variable reliability data $b_1(i,j)$ and the last variable value $b_1(i,j-1)$ may be represented by Eq. (2), where $f_1$ represents a variable reliability data update rule with an output value of 0 or 1, indicating whether the previous variable node reliability data should be toggled or flipped. Similar to the variable value update rule $f_0$, in more general cases, the variable reliability data update rule may be dependent on the number of iterations already performed, or the updated variable node reliability data $b_1(i,j)$ may be generated directly.

$$b_1(i,j)=b_1(i,j-1)\oplus f_1(b_0(i,j-1),b_1(i,j-1),u(i,j)) \quad (2)$$

For symmetric channels with symmetric inputs, the probability of detecting a 0 at detector 120 is equal to the probability of detecting a 1. In this case, the update rules $f_0$ and $f_1$ may be independent of the variable value input $b_0(i,j)$. Hence, the update rules as given in Eqs. (1) and (2) may be simplified in accordance with Eqs. (3) and (4).

$$b_0(i,j) = b_0(i,j-1) \oplus f_0(b_1(i,j-1), u(i,j)) \quad (3)$$

$$b_1(i,j) = b_1(i,j-1) \oplus f_1(b_1(i,j-1), u(i,j)) \quad (4)$$

The number of unsatisfied checks $u(i,j)$ associated with variable node i at iteration j takes on values from 0 to $d_v$, where $d_v$ denotes the degree of variable node i, and is the column-weight in the LDPC parity check matrix H. Thus, the second input to $f_0$ and $f_1$ shown in Eqs. (3) and (4) ranges from 0 to $d_v$, and the two bit-flip rules $f_0$ and $f_1$ can be implemented in a lookup table as shown in FIG. 3.

FIG. 3 shows two lookup tables 300 and 350 implementing rules $f_0$ and $f_1$ for updating single-bit variable node values and single-bit variable node reliability data, in accordance with an embodiment of the present disclosure. As shown in FIG. 3, lookup table 300 contains two rows 310 and 320, which are used to update the hard decisions associated with the variable nodes. Lookup table 350 contains two rows 360 and 370, which are used to update the reliability data associated with the variable nodes. Each update rule or "flip decision" within the flip vectors indicates if the current value of the variable node should be flipped or otherwise modified according to the number of unsatisfied check nodes and the associated reliability data. Lookup tables such as lookup tables 300 and 350 may be implemented as part of decoder 124, and may be programmable.

The rows 310 and 320 may represent the same update rules or different update rules. Similarly, the update rules represented by rows 360 and 370 may be the same or different. In one embodiment, update rules may be chosen in real time, depending on whether the variable node i in the current iteration j is reliable. In an example, if the variable node is currently unreliable and if $f_0(0, u(i,j))=1$, the hard decision or variable value associated with the node is flipped. If the variable node is currently unreliable and if $f_1(0, u(i,j))=1$, the reliability data of the node is flipped. Furthermore, if the variable node is currently reliable and if $f_0(1,(u(i,j)))=1$, the variable value associated with the node is flipped. If the variable node is currently reliable and if $f_1(1, u(i,j))=1$, the reliability of the node is flipped.

As discussed in relation to FIG. 2, in more general settings where update rules $f_0$ and/or $f_1$ vary from iteration to iteration, lookup tables 300 and 350 shown in FIG. 3 may include additional rows or columns indexed by iteration number. In addition, with non-binary codes and/or more than one bit of reliability data, lookup tables 300 and 350 shown in FIG. 3 may also include additional rows of columns indexed by bit number.

Figure 4:
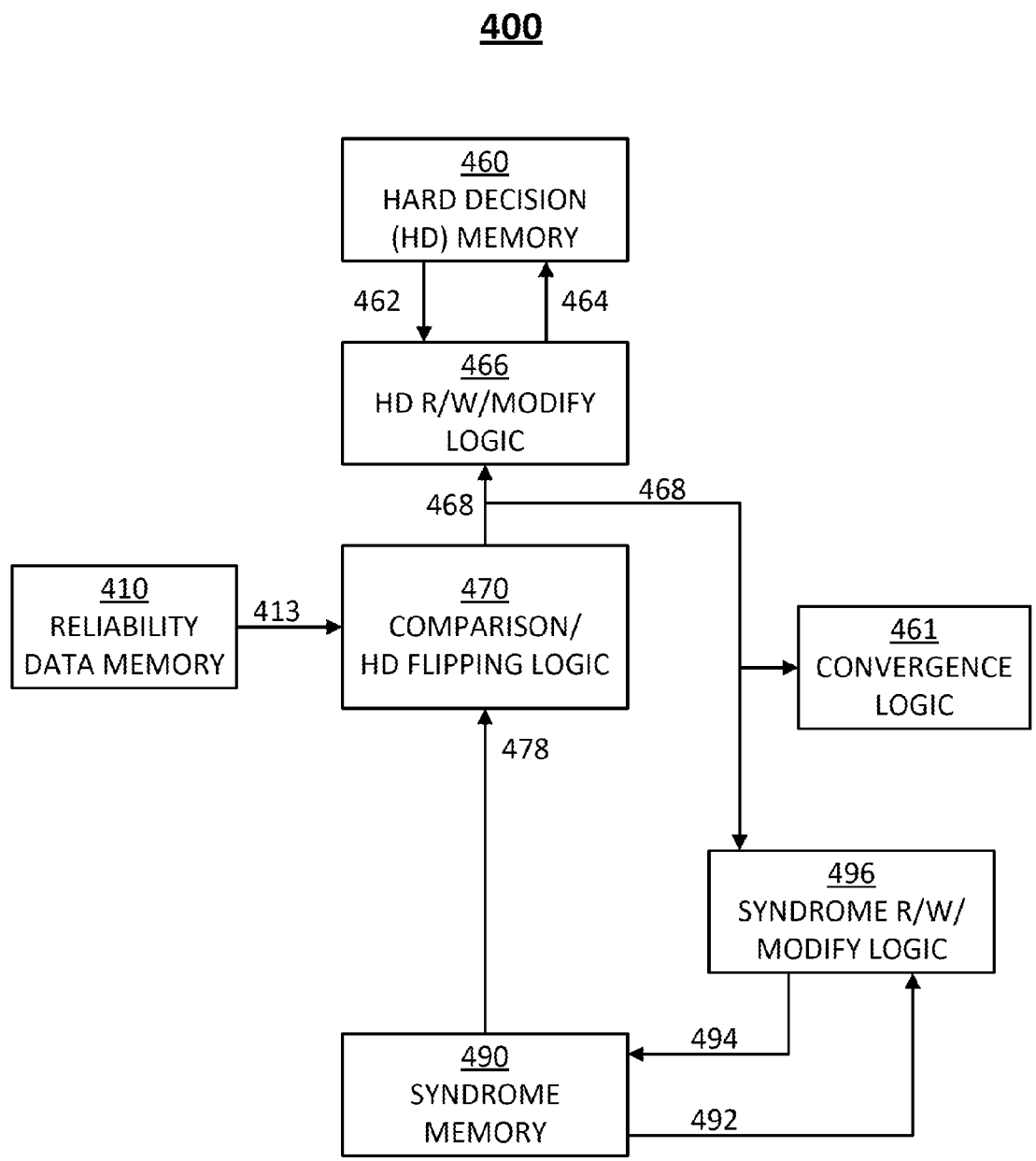
FIG. 4 is a block diagram of an illustrative system for LDPC decoding based on variable node reliability data, in accordance with an embodiment of the present disclosure.

FIG. 4 is a block diagram of an illustrative decoder system 400 for LDPC decoding based on variable node reliability data, in accordance with an embodiment of the present disclosure. The system 400 may implement the decoding process as illustrated by FIGS. 2A and 2B, and the variable value update rule given by Eq. (3). Hard decision values and variable reliability data are stored in hard decision (HD) memory 460 and reliability data memory 410, respectively, and syndrome values for check nodes are stored in syndrome memory 490. Reliability data 413 is provided by reliability data memory 410 to the comparison/HD flipping logic 470, which also receives syndrome values 478 from syndrome memory 490. Comparison/HD flipping logic 470 may implement the variable update rules 310 and 320 shown in FIG. 3. The flip decisions 468 are provided to the HD read/write/modify (R/W/Modify) logic 466 for modifying, updating or flipping one or more of the variable values 462. The variable values 462 are received at HD R/W/Modify logic 466 from HD memory 460. After generating the one or more updated variable values, HD R/W/Modify logic 466 transmits the updated variable values 464 to HD memory 460 for storage. The flip decisions 468 are also transmitted to syndrome R/W/Modify logic 496 and convergence logic 461. Syndrome R/W/Modify logic 496 receives syndrome values 492 from syndrome memory 490 and examines multiple variable nodes associated with particular check nodes to update check node values, and any updated syndrome values 494 are stored in syndrome memory 490. In addition, convergence logic 461 implements one or more convergence or termination conditions for the decoding process to determine whether convergence has been reached or whether termination of the decoding process is appropriate.

In some implementations, one or more of HD memory 460, reliability data memory 410 and syndrome memory 490 may be implemented in the same memory location. HD R/W/Modify logic 466 and syndrome R/W/Modify logic 496 may also share the same circuitry. In some implementations, more than one variable or check nodes are updated in parallel. For example, the number P of variable nodes concurrently updated may be equal to 100, 1000, or any other suitable number, and may depend on the size of the circuit and the codeword length. In some implementations, P variable nodes are updated in parallel. In this case, each of the input signals and output signals shown in FIG. 4 may include P bits or symbols of data, except syndrome value 478, 492, and updated syndrome value 494, which includes $d_v \times P$ bits or symbols of data. In some implementations, the storage or communication channel 114 is asymmetric. In this case, the variable value update rule as implemented by comparison/HD flipping logic 470 may further depend on variable value 462 as stored in HD memory 460, and a direct connection may be implemented between HD memory 460 and comparison/HD flipping logic 470.

Moreover, in some embodiments, comparison/HD flipping logic 470 determines whether any of P variable values are to be updated (i.e., a non-zero flip decision vector 468), and invokes the HD R/W/Modify logic 466 and/or the syndrome R/W/Modify logic 496 if and only if at least one of the P variable values is to be updated, thus reducing power consumption by eliminating unnecessary memory updates. In other words, if none of the P variable values are to be flipped according to the variable value update rule, then no update to the HD memory 460 or the syndrome memory 490 is performed.

Figure 5:
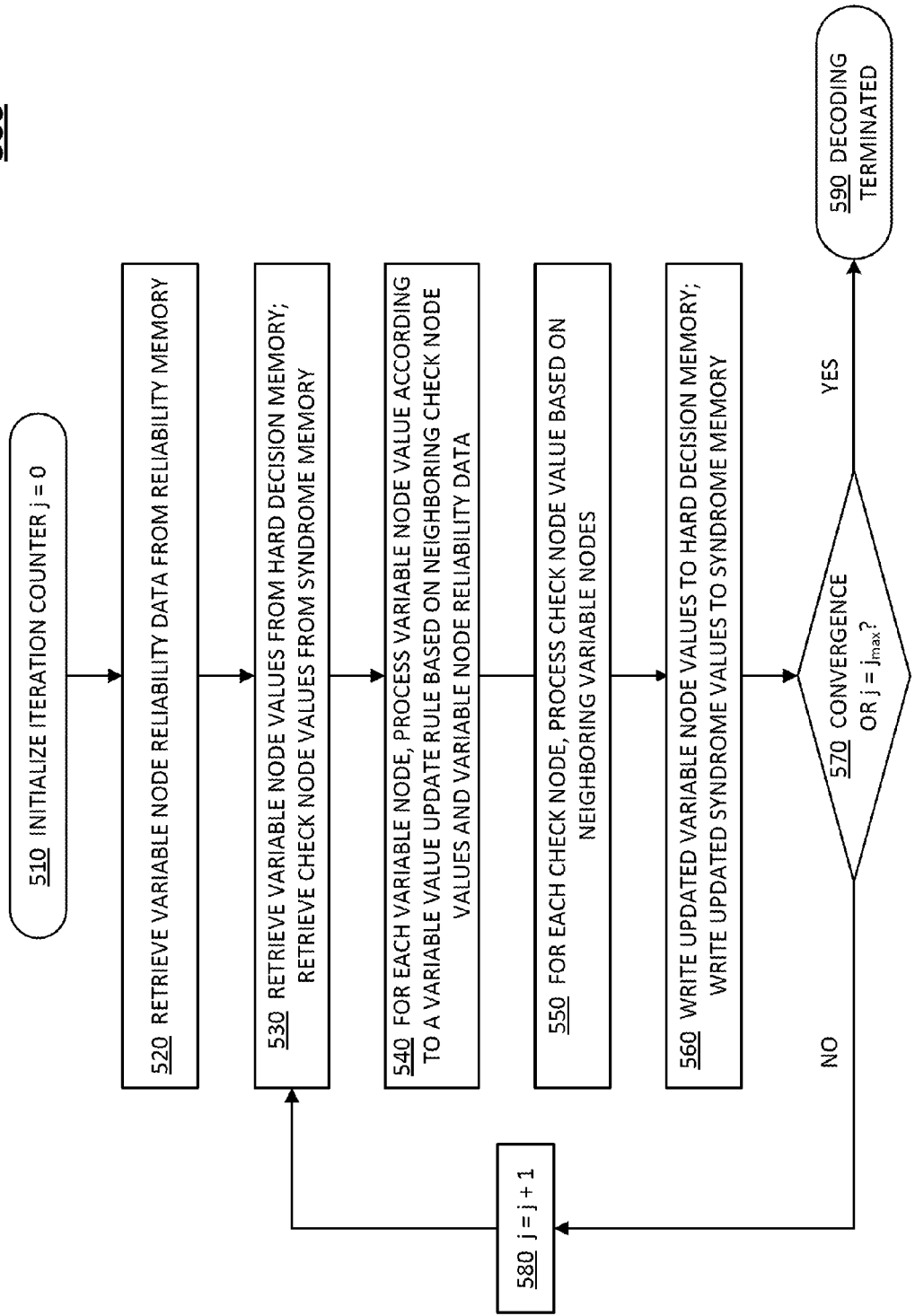
FIG. 5 is a flowchart of an illustrative process for LDPC decoding based on variable node reliability data, in accordance with an embodiment of the present disclosure.

FIG. 5 is a flowchart of an illustrative process 500 for LDPC decoding based on variable node reliability data, in accordance with an embodiment of the present disclosure. Process 500 may be implemented using the decoder system 400 shown in FIG. 4. System 400 may begin the decoding process by initializing an iteration counter j at 510. Variable node reliability data 413 are retrieved from reliability memory 410 at 520. Variable node values 462 are retrieved from HD memory 460 and check node syndrome values 478 and 492 are retrieved from syndrome memory 490 at 530. At 540, comparison/HD flipping logic 470 and HD R/W/Modify logic 466 process each variable node value according to a variable value update rule, which is based on neighboring check node values and variable node reliability data. A variable node that neighbors a check node is a variable node that has a connection to the check node. For example, a variable update rule may be implemented according to Eq. (3). At 550, comparison/HD flipping logic 470 and HD R/W/Modify logic 496 update check node values based on neighboring variable nodes, which may be performed after or concurrently with variable node updates. In an example, updated check node or syndrome values may be recomputed from updated variable values. Alternatively, check node values may be updated by the syndrome R/W/Modify logic 496 from portions of flip decisions 468 that correspond to variable nodes associated with or connected to the particular check node under consideration. At 560, updated variable node values are written into HD memory 460, and updated syndrome values are written into syndrome memory 490. Convergence logic 461 determines whether one or more convergence or termination conditions are satisfied at 570. For example, if the all-zero syndrome is achieved, or if a maximum iteration number $j_{max}$ is reached, convergence logic 461 may declare that decoding is terminated at 590. In particular, a decoding successful or decoding failure flag may be raised depending on the syndrome values. Otherwise, if convergence logic 461 determines that none of the convergence or termination conditions are satisfied at 570, the iteration counter j is incremented at 580, and process 500 returns to 530 to retrieve variable node values and check node values.

The flowchart 500 shown in FIG. 5 is an illustrative example of how the decoder system 400 may be controlled to perform the decoding process. Other alternative control processes are also possible. For example, 560 may include two discrete steps that occur at different times. In particular, the writing of updated variable node values may be performed before 550, while the writing of updated check node values may be performed after 550. In another example, the writing at 560 may be performed after 570, when none of the termination conditions have been satisfied.

The decoder system 400 shown in FIG. 4 illustrates a general system where variable node and consequently check node values are updated according to variable node reliability data. In system 400, reliability data memory 410 is shown as having a single port, and the variable node reliability data are not updated during the decoding process. Compared with a system where reliability data are also updated, the decoder system 400 may be more efficient in terms of memory and energy use.

Moreover, comparison/HD flipping logic 470 may be implemented according to the lookup table 300, indexed in the horizontal direction by the number of unsatisfied check nodes. Syndrome value 478 contains $d_v \times P$ bits or symbols of data corresponding to P variable nodes to be updated and $d_v$ check nodes associated with each variable node. In some implementations, a shifter is positioned between the syndrome memory 490 and the comparison/HD flipping logic 470 so that the syndrome values or check node values associated with each variable node are aligned for tallying the number of unsatisfied check nodes and for comparing to the lookup table 300. Similarly, an inverse shifter may be positioned between the comparison/HD flipping logic 470 and the syndrome R/W/Modify memory 496 for reversing the shifting performed by the shifter, such that updated syndrome values 494 may be written to the syndrome memory 490 in a predetermined order or format.

Figure 6:
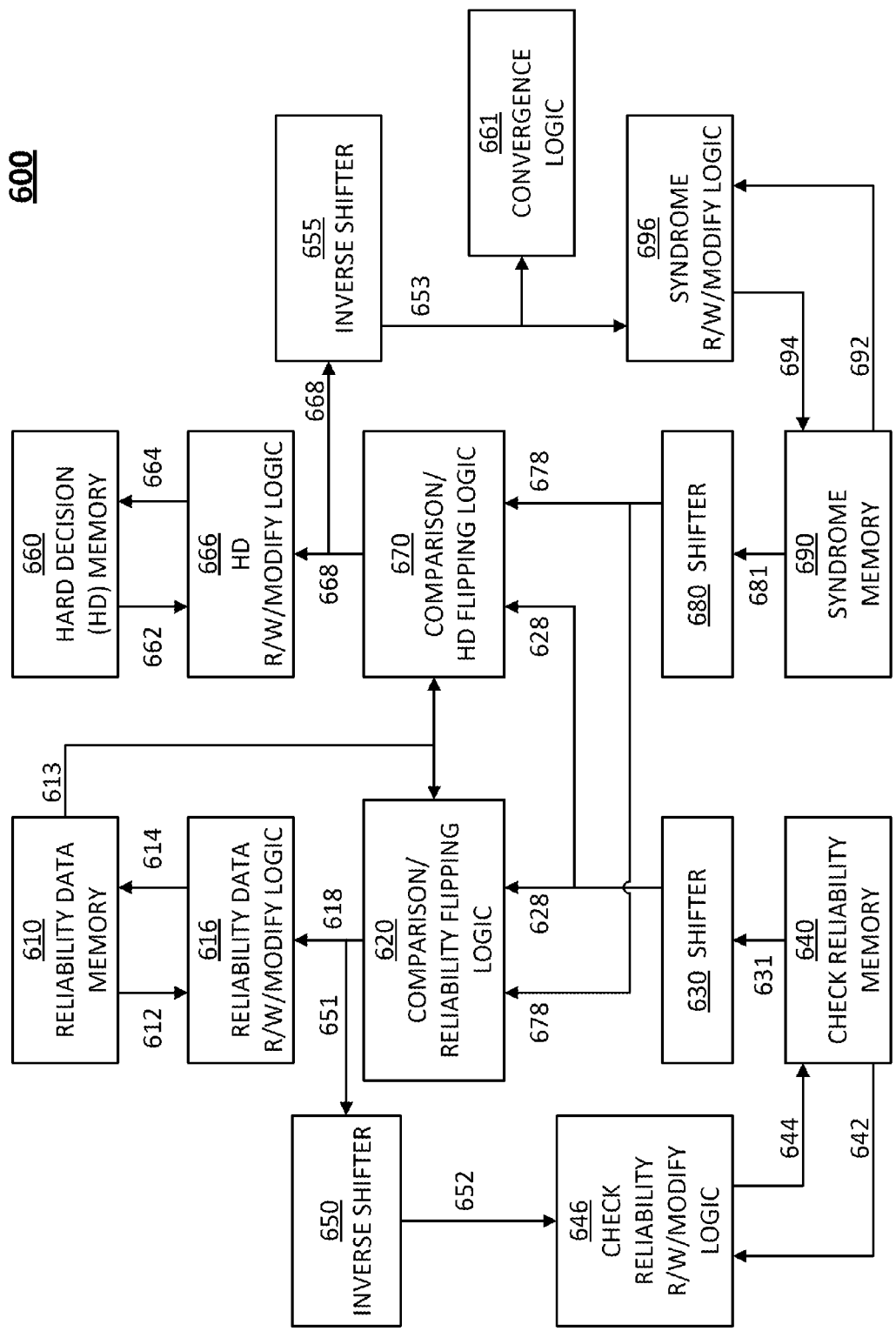
FIG. 6 is a block diagram of an illustrative system for LDPC decoding based on variable node reliability data and check node reliability data, in accordance with an embodiment of the present disclosure.

FIG. 6 is a block diagram of an illustrative decoder system 600 for LDPC decoding based on variable node reliability data and check node reliability data, in accordance with an embodiment of the present disclosure. While decoder system 400 shown in FIG. 4 is configured to perform updating of the hard decisions but not updating of the variable reliability data, decoder system 600 is configured to perform updating of both the hard decisions and the variable reliability data. In addition, decoder system 600 includes additional circuitry for utilizing and updating check reliability data in the decoding process. An example process for using decoder system 600 is described in relation to FIG. 7.

In system 600, HD values are stored in hard decision (HD) memory 660, variable reliability data are stored in reliability data memory 610, syndrome values for check nodes are stored in syndrome memory 690, and reliability data are stored in check reliability memory 640 respectively. In particular, reliability data 613, syndrome values 681, and syndrome reliability values 631 are provided by reliability data memory 610, syndrome memory 690 and check reliability memory 640, respectively. Shifter 680 may realign one or more syndrome values 681 to provide a shifted output 678 to comparison/HD flipping logic 670 and comparison/reliability flipping logic 620. Similarly, shifter 630 may realign one or more check reliability values 631 to provide a shifted output 628 to comparison/HD flipping logic 670 and comparison/reliability flipping logic 620.

Although not shown explicitly in FIG. 6, components of decoder system 600 may be turned on or off based on whether variable reliability data, check reliability data, or both variable reliability data and check reliability data are relied upon for the decoding process. Moreover, components of decoder system 600 may be turned on or off based on whether variable reliability data, check reliability data, or both variable reliability data and check reliability data are updated during the decoding process, in addition to updating variable node values and check node syndrome values. In one example, decoder system 600 may implement the decoding process as described in relation to FIGS. 2A and 2B. The variable value update rules may use lookup tables 300 and 350 shown in FIG. 3 to be implemented in accordance with Eqs. (3) and (4). In an example, because the variable value update rules as shown in FIG. 3 do not rely on check reliability data, several components in decoder system 600 may be turned off or otherwise deactivated. In particular, check reliability memory 640, shifter 630, check reliability R/W/Modify logic 646, and inverse shifter 650 may be deactivated. In an example, all of the components of system 600 may be turned on or otherwise activated, such that variable value update rules, variable reliability update rules, and check reliability update rules are accordingly programmed into lookup tables similar to those shown in FIG. 3.

The right-hand side of decoder system 600 is similar to decoder system 400, except that the right-hand side decoder system 600 includes shifter 680 and inverse shifter 655 for aligning syndrome values and realigning flipping decisions. In particular, comparison/HD flipping logic 670 generates HD flipping decisions 668 based on one or more of reliability data 613, syndrome value 678, and check reliability data 628. HD flipping decisions 668 are transmitted to HD R/W/Modify logic 666, which generates updated hard decisions 664 and stores the updated hard decisions 664 into HD memory 660. HD flipping decisions 668 are also transmitted to inverse shifter 655, which realigns HD flipping decisions 668 to generate realigned HD flipping decisions 653. Realigned HD flipping decisions 653 are transmitted to syndrome R/W/Modify logic 696 to generate updated syndrome values and updated check reliability values, which are stored into syndrome memory 690. Furthermore, realigned HD flipping decisions 653 are also transmitted to convergence logic 661, which implements one or more convergence of termination tests to determine whether to end the decoding process.

The left-hand side of decoder system 600 is similar to the right-hand side of decoder system 600, except that the right-hand side of decoder system 600 is used for updating hard decisions, the left-hand side of decoder system 600 is used for updating reliability data. In particular, comparison/reliability flipping logic 620 generates reliability flip decisions 618 based on one or more of reliability data 613, syndrome value 678, and check reliability data 628. Reliability flipping decisions 618 are transmitted to reliability data R/W/Modify logic 616, which generates updated reliability data 614 and stores the updated reliability data 614 into reliability data memory 610. comparison/reliability flipping logic 620 generates reliability flip decisions 651, which are transmitted to inverse shifter 650, which realigns reliability flip decisions 651 to generate realigned reliability flip decisions 652. Re-aligned reliability data 652 are transmitted to check reliability R/W/Modify logic 646 to generate updated check reliability data 644, which are stored into check reliability memory 640.

In some implementations, one or more of HD memory 660, reliability data memory 610, syndrome memory 690, and check reliability memory 640 may be implemented in the same memory location. One or more of HD R/W/Modify logic 666, reliability data R/W/Modify logic 616, syndrome R/W/Modify logic 696, and check reliability R/W/Modify logic 646 may share the same circuitry. In addition, in implementations where P variable nodes are concurrently updated in parallel, several of the input/output signals shown in FIG. 6 may include P bits or symbols of data. In particular, all signals may include P bits of symbols, except those related to the check nodes (i.e., syndrome values 681, 678, 692, and 694; syndrome reliability values 631, 628, 642, and 644), which each may include $d_v \times P$ bits or symbols of data. In some implementations where the storage or communication channel 114 is asymmetric, the variable value update rule as implemented by comparison/HD flipping logic 670 may further depend on variable value 662 as stored in HD memory 660, and an additional connection may be wired between HD memory 660 and logic 670.

Figure 7:
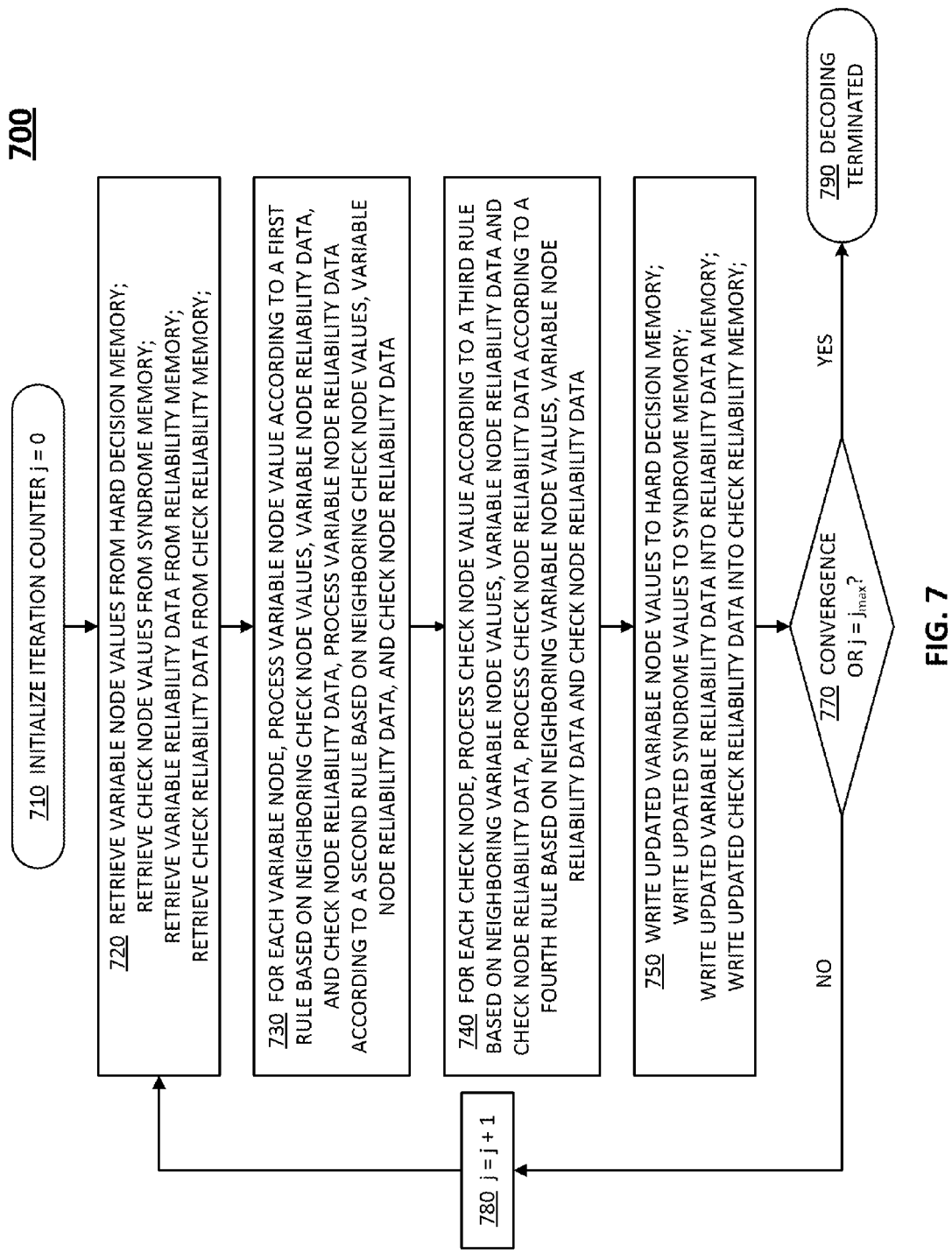
FIG. 7 is a flowchart of an illustrative process for LDPC decoding based on variable node reliability data and check node reliability data, in accordance with an embodiment of the present disclosure.

FIG. 7 is a flowchart of an illustrative process 700 for LDPC decoding based on variable node reliability data and check node reliability data, in accordance with an embodiment of the present disclosure. Process 700 may be implemented using the decoder system 600 shown in FIG. 6. System 600 may begin the decoding process by initializing an iteration counter j at 710, and retrieving data at 720. In particular, variable node reliability data 612 and 613 may be retrieved from reliability memory 610, variable node values 662 may be retrieved from HD memory 660, check node syndrome values 681 and 692 may be retrieved from syndrome memory 690, and check reliability data 631 and 642 may be retrieved from check reliability memory 640. In addition, some of the retrieved data may be aligned using a shifter. In particular, check reliability data 631 may be aligned using shifter 630, and check node syndrome value 681 may be aligned using shifter 680.

At 730, each variable node value is processed according to a first rule based on neighboring check node values, variable node reliability data, and check node reliability data. Furthermore, variable node reliability data is processed according to a second rule based on neighboring check node values, variable node reliability data, and check node reliability data. In particular, comparison/HD flipping logic 670 generates HD flip decisions 668 and comparison/reliability flipping logic 620 generates reliability flip decisions 618 based on corresponding inputs that have been retrieved from different memories. The first rule and the second rule may be different rules that are implemented in lookup tables similar to those shown in FIG. 3. HD R/W/Modify logic 666 generates updated variable values 664, and reliability R/W/Modify logic 616 generates updated variable reliability data 614 according to the flip decisions.

At 740, check node values and check node reliability data are updated based on neighboring variable nodes. In particular, check node values are processed according to a third rule based on neighboring variable node values, variable node reliability data, and check node reliability data. Furthermore, check node reliability data are processed according to a fourth rule based on neighboring variable node values, variable node reliability data, and check node reliability data. In an example, updated syndrome values may be computed based on updated variable values. In another example, syndrome R/W/Modify logic 696 may compute updated syndrome values based on portions of HD flip decisions 668 that correspond to variable nodes that neighbor the check node under consideration. In another example, check reliability R/W/Modify logic 646 may update the check node reliability data based on reliability flip decisions 652, appropriately re-aligned by inverse shifter 650 from output 618 of the comparison/reliability flipping logic 620.

At 750, updated variable node values are written to hard decision memory 660, updated syndrome values are written to syndrome memory 690, updated variable reliability data is written to reliability data memory 610, and updated check reliability data is written to check reliability memory 640. In general, one or more of the steps of 750 may not be performed, if no update was performed. At 770, convergence logic 661 determines whether one or more convergence or termination conditions are satisfied. In an example, the decoding process may be terminated at 790 if an all-zero syndrome is achieved or if a maximum iteration number $j_{max}$ has been reached. At 790, upon termination of the decoding process, a decoding successful or decoding failure flag may be raised depending on the syndrome value. If none of the convergence or termination conditions are satisfied at 770, the iteration counter j is incremented at 780, and the decoding process 700 returns to 720 to retrieve data from the various memory units.

The flowchart 700 shown in FIG. 7 is an illustrative example of how decoder system 600 may be controlled to perform the decoding process. Other alternative control processes are also possible, where different components of the system 600 may be turned on or off, and where different components of the system 600 may be configured to function with desired timing offsets.

The decoder system 600 shown in FIG. 6 illustrates a general system where variable node values, variable node reliability data, check node values, and check node reliability data are updated according to variable node reliability data and check node reliability data. In some implementations, long codeword lengths and high precision check reliability data may cause that the comparison/HD flipping logic 670 and comparison/reliability flipping logic 620 be less efficient than is desirable. As one way to reduce power consumption, comparison/reliability flipping logic 620 may be implemented using a check node combination generator 824 and table lookup circuitry 822 as shown in FIG. 8.

Figure 8:
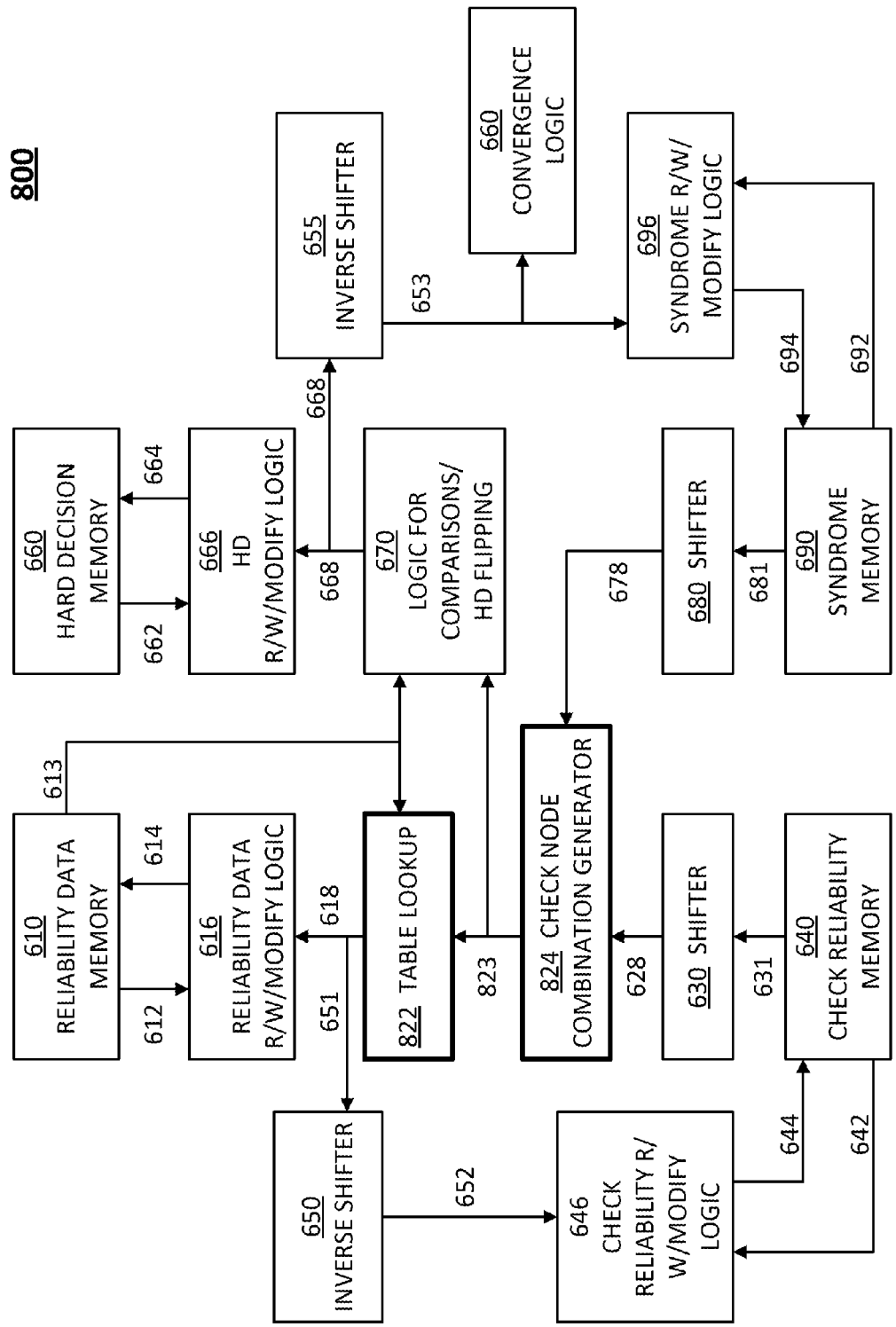
FIG. 8 is a block diagram of an illustrative system for LDPC decoding based on variable node reliability data and check node reliability data, using a check node combination generator, in accordance with an embodiment of the present disclosure.

FIG. 8 is a block diagram of an illustrative system 800 for LDPC decoding based on variable node reliability data and check node reliability data, in accordance with an embodiment of the present disclosure. System 800 is similar to system 600, with many equivalent components that are labeled with the same element numbers, except that system 800 replaced the comparison/reliability flipping logic 620 of system 600 with a check node combination generator 824 and a table lookup circuitry 822. The check node combination generator 824 generates lookup table indices based on check node values and check node reliability data, while the table lookup circuitry 822 uses the output 823 of the check node combination generator 824 to identify corresponding bit or symbol flipping rules stored in lookup tables. The inputs to check node combination generator 824 are aligned check reliability data 628 and aligned syndrome values 678. In addition, output 823 of the check node combination generator 824 is provided to the comparison/HD flipping logic 670.

In a general bit or symbol flipping decoder, a state of a variable node is selected from a finite alphabet $A_v$, while a state of a check node is selected from another finite alphabet $A_c$. In some embodiments, the state of a variable or a check node is equivalent to the value of the variable or check node. In some embodiments, the state of a variable or check node is equivalent to a combination of the node value and the node reliability data. For example, a variable node may be associated with a two-bit state denoted by $[b_1 \, b_0]$, where $b_0$ indicates the hard decision and $b_1$ indicates the reliability of the hard decision. Updating the variable value $b_0$ and updating the variable reliability data $b_1$ are then equivalent to updating the state $[b_1 \, b_0]$ of a variable node. In other words, the state of a variable node may be updated based on its current state and the combination of states of its neighboring check nodes, which are check nodes associated with or connected to the variable node under consideration.

Similarly, in some embodiments, a check node may be associated with a two-bit state, where the first bit represents the syndrome value of the check node, and the second bit represents the reliability of the check node. In particular, a state of 00 may represent a satisfied check node with a certain unreliability, a state of 10 may represent a satisfied check node with a certain reliability, a state of 01 may represent an unsatisfied check node with a certain unreliability, and a state of 11 may represent an unsatisfied check node with a certain reliability.

In some embodiments, check nodes with the same state may be treated equivalently. In other words, update rules may depend on the number of check nodes in a particular state, rather than the exact pattern of the states of the check nodes. In this case, check node combination generator 824 generates and indexes an $|A_c|$-tuple $(x_1, x_2, \ldots, x_{|A_c|})$ to uniquely represent the combination of states of the $d_v$ check nodes that neighbor a particular variable node under consideration, such that $\Sigma x_i = d_v$, where each $x_i$ is a non-negative integer. By assigning indices to such tuples using the check node combination generator 824, table lookup circuitry 822 is configured to perform a fast table lookup operation. Advantageously, the fast table lookup operation improves the speed and power efficiency of the decoding system.

In some embodiments, all $|A_c|$-tuples that have values that sum to $d_v$ are indexed from 0 to $T(d_v, |A_c|) - 1$, where $T(d_v, |A_c|)$ is the number of $|A_c|$-tuples that have elements that sum to $d_v$. For example, $T(6,4)$ is equal to 84, $T(8,4)$ is equal to 165, $T(6,3)$ is equal to 28, and $T(5,3)$ is equal to 21. $|A_c|$-tuples may be ordered lexicographically before indices are assigned. In an example, for two $|A_c|$-tuples $(x_1, x_2, \ldots, x_{|A_c|})$ and $(y_1, y_2, \ldots, y_{|A_c|})$, the index of $(x_1, x_2, \ldots, x_{|A_c|})$ is less than the index of $(y_1, y_2, \ldots, y_{|A_c|})$ if and only if the first $x_i$ that is different from $y_i$ is less than $y_i$ in value.

FIG. 9A shows a table 900 of lexicographically ordered 4-tuples, where elements of each tuple sum to 6. In other words, table 900 includes a list of tuples, each with size $|A_c|=4$ and $d_v=6$. Each of the 84 columns in table 900 includes a set of four elements that sum to 6. The columns are indexed from 0 to 83. Since $T(6,3)=28$, there are 28 tuples with $x_1=0$, indexed from 0 to 27. Similarly, since $T(5,3)=21$, there are 21 tuples with $x_1=1$, indexed from 28 to 48. Given an $|A_c|$-tuple $(x'_1, x'_2, \ldots, x'_{|A_c|})$, its index may be calculated recursively by summing the number of tuples with $x_1 \leq x''_1 - 1$ and the index of $(x'_2, \ldots, x'_{|A_c|})$. For example, when $|A_c|=4$, the index of 4-tuple $(x'_1, x'_2, x'_3, x'_4)$ is given by Eq. (5), where $x'_4 = d_v - x'_1 - x'_2 - x'_3$.

$$\text{index}(x'_1, x'_2, x'_3, x'_4) = \sum_{i=1}^{x'_1} \binom{d_v + 3 - i}{2} + \sum_{i=1}^{x'_2} (d_v - x'_1 + 2 - i) + x'_3 \quad (5)$$

In some embodiments, the sum of the first two terms in Eq. (5) are pre-calculated as a function of $x'_1$ and $x'_2$, and stored in a check combination lookup table 930, as shown in FIG. 9B. For example, FIG. 9C shows an illustrative check combination lookup table 950 for the sum of the first two terms of Eq. (5) when $d_v=6$. To determine the index of a 4-tuple $(x'_1, x'_2, x'_3, x'_4)$, the entry in the table 950 at row $x'_1$ and column $x'_2$ is added to the value of $x'_3$.

Figure 10:
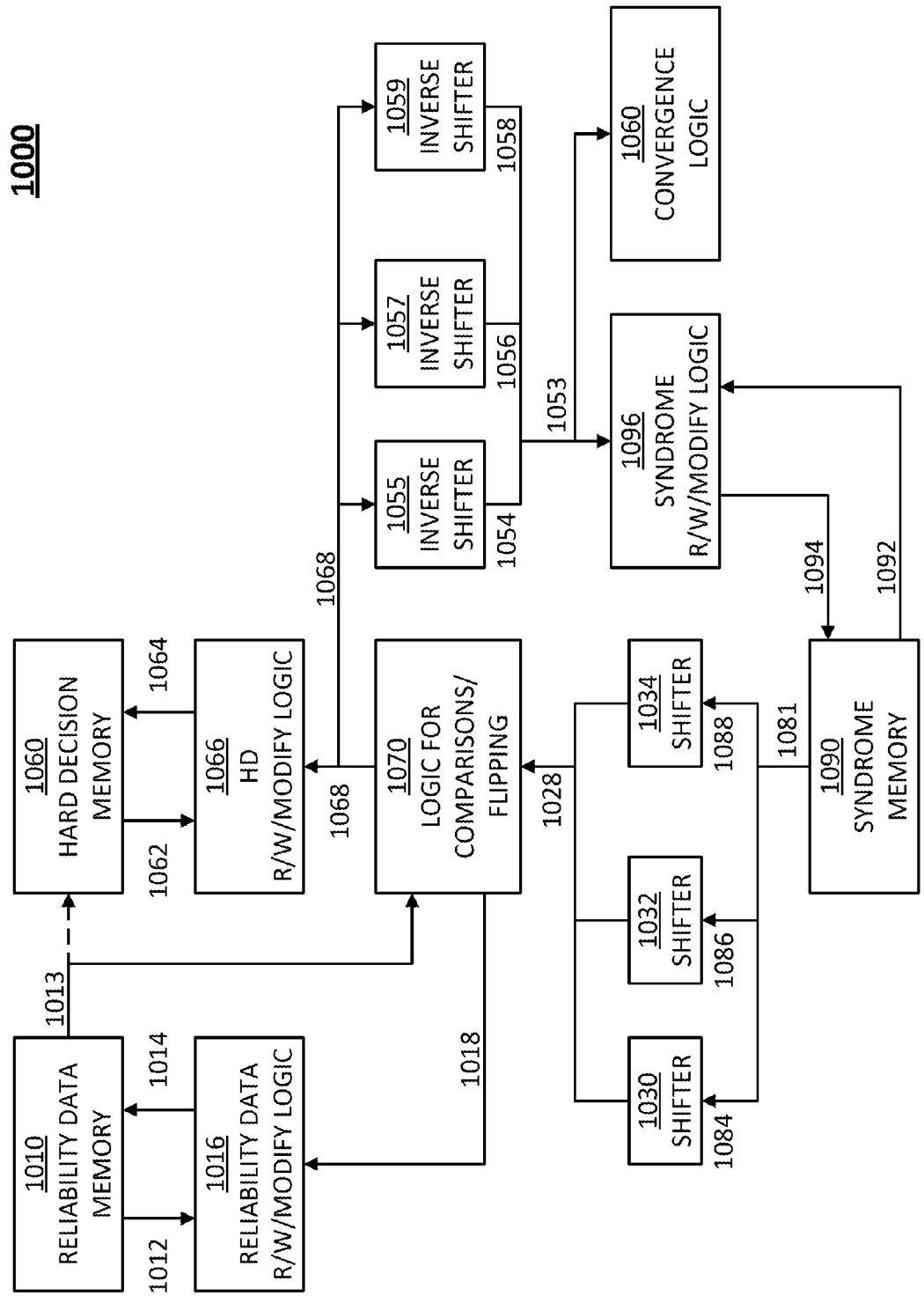
FIG. 10 is a block diagram of an illustrative system for LDPC decoding based on variable node reliability data, in accordance with an embodiment of the present disclosure.

FIG. 10 is a block diagram of an illustrative decoder system 1000 for LDPC decoding based on variable node reliability data, in accordance with an embodiment of the present disclosure. In decoder system 1000, a single bit of storage is provided per check node to store check node syndrome values, without check node reliability information. System 1000 may also be implemented as a similar system as system 600 or system 800, with one or more components related to syndrome reliability disabled or turned off, to reduce power consumption while providing good performance characteristics. Elements in system 1000 that share the same last two digits as elements in systems 600 or 800 are equivalent.

In system 1000, when P variable nodes are updated in parallel, each of the input/output signals may include P bits or symbols of data, except syndrome values 1081, 1092, and updated syndrome values 1094, where each updated syndrome value includes $d_v \times P$ bits or symbols of data. Each tuple further includes variable reliability data 1012, updated reliability data 1014, and reliability flipping decision 1018, each of which includes $r \times P$ bits or symbols of data, where r is the number of bits or symbols of reliability data per variable node. In an example, r may be equal to 1 or 2.

System 1000 also includes three parallel shifters 1030, 1032, and 1034, each of which receives P bits or symbols of input 1084, 1086, and 1088, and parallel inverse shifters 1055, 1057, and 1059, each providing P bits or symbols of output 1054, 1056, and 1058. As shown in FIG. 10, $d_v=3$ because three parallel shifters and three parallel inverse shifters are used. However, in general, any number of parallel shifters and parallel inverse shifters may be used. Parallel shifters and parallel inverse shifters allow syndrome values to be aligned with different offsets relative to lookup tables implemented by comparison/flipping logic 1070, thereby simplifying the comparison and table lookup process, leading to potential power savings.

In some embodiments, system 1000 may include a single port reliability memory 1010 and reliability data R/W/Modify logic 1016 may be turned off, thus disabling the dependence of the variable node update rule on variable reliability data to achieve additional power savings.

Figure 11:
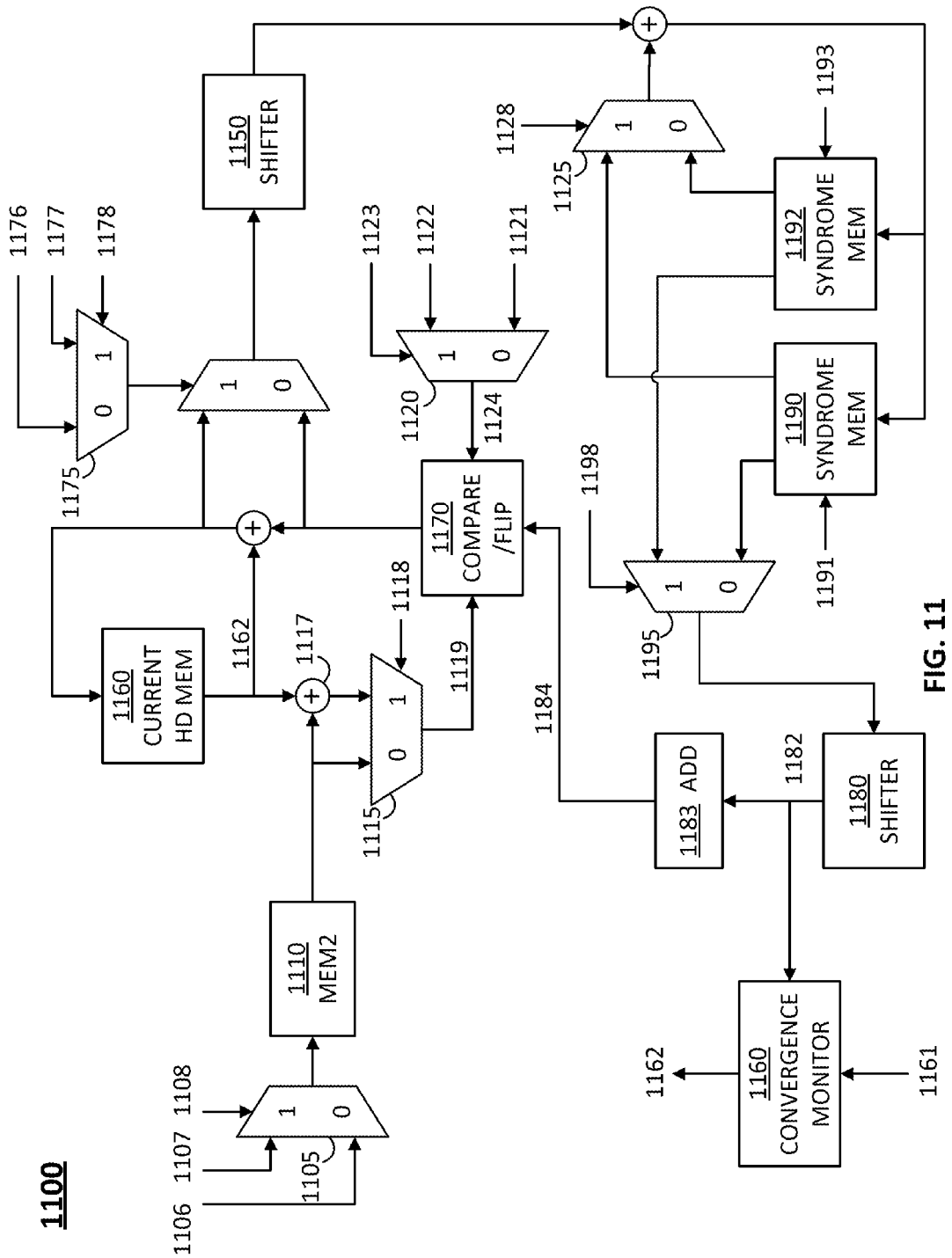
FIG. 11 is a block diagram of an illustrative decoder architecture for LDPC decoding based on variable node reliability data, in accordance with an embodiment of the present disclosure.
Figure 12:
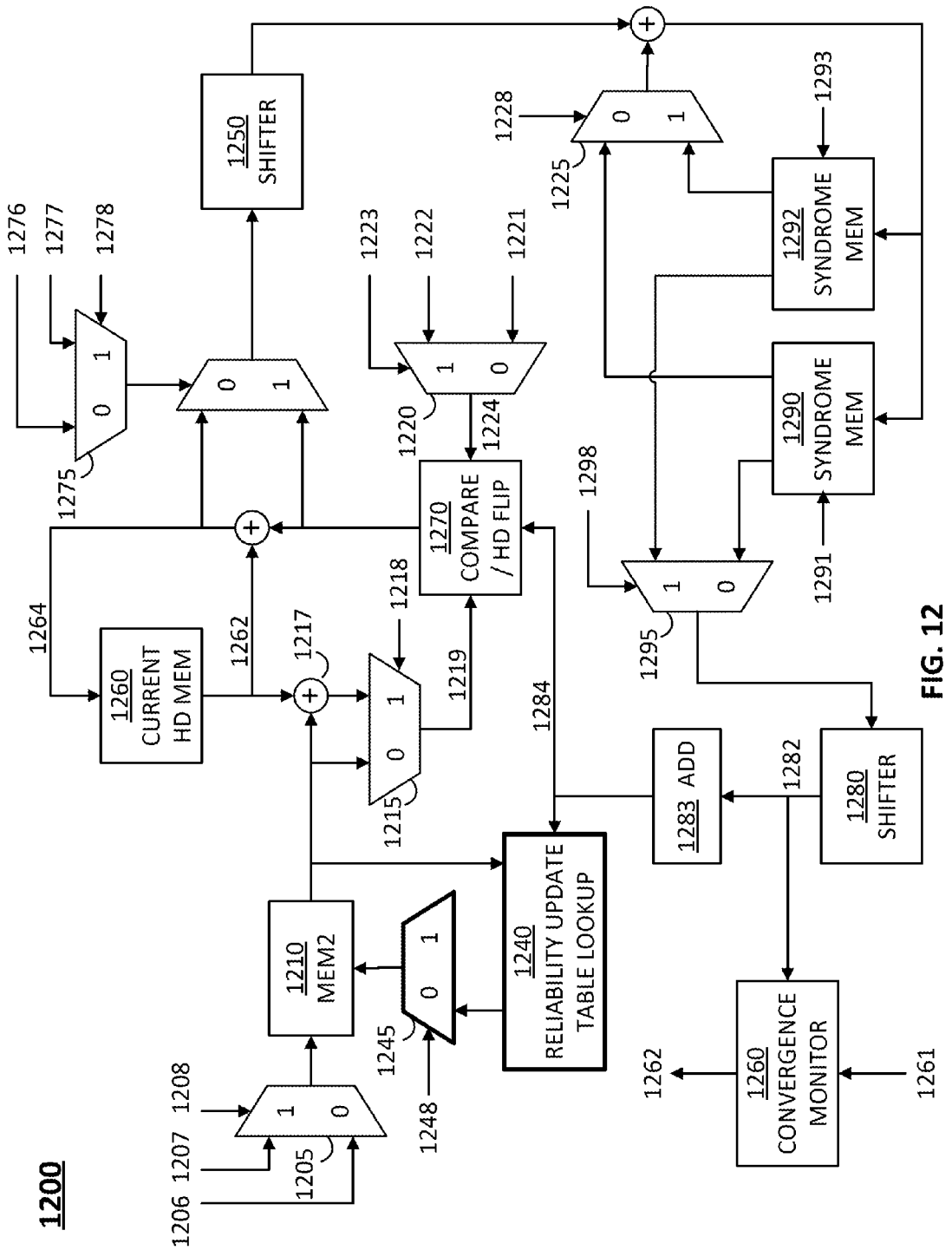
FIG. 12 is a block diagram of an illustrative decoder architecture for LDPC decoding based on variable node reliability data, in accordance with an embodiment of the present disclosure.

FIGS. 11 and 12 show two illustrative decoder architectures 1100 and 1200 for LDPC decoding based on variable node reliability data, in accordance with some embodiments of the present disclosure. These architectures illustrate efficient realizations of decoding systems with two bit inputs (i.e., one bit HD input, one bit reliability input). In the architecture 1100, the variable reliability data memory MEM2

1110 is single port, while in the architecture 1200, variable reliability data stored in MEM2 1210 is updated using the reliability update table lookup logic 1240. The architecture 1100 may be used to implement the system 400 shown in FIG. 4.

In the architecture 1100, inputs 1106 and 1107 to the multiplexer (MUX) 1105 are variable reliability bits and raw HD bits respectively. Control input 1108 is 0 if two-bit input decoding is enabled. Thus, reliability based decoding is enabled when the input is two bits in length, and disabled when the input is only one bit in length. Similarly, control input 1118 to MUX 1115, control input 1178 to MUX 1175, and control input 1123 to MUX 1120 are 0 if two-bit input decoding is enabled. Furthermore, output 1162 of the current HD memory 1160 is connected to the compare/flip logic 1170 through the MUX 1115, where the adder 1117 is disabled if two-bit input decoding is enabled.

With two-bit input decoding, in addition to input 1119, compare/flip logic 1170 receives syndrome related information 1184 and threshold set input 1124 as inputs. Syndrome related information 1184 is generated from add logic 1183, which computes the number of unsatisfied check nodes, according to output 1182 of the shifter 1180, which in turn is connected to syndrome memory units 1190 or 1192 through MUX 1195. Shifter 1180 may include $d_v$ shifters in parallel, as shown in FIG. 10. Control signal 1198 to the MUX 1195 is 0 if the current iteration count satisfied a first condition (e.g., is odd), or if instantaneous syndrome update is enabled. By comparison, control signal 1128 to MUX 1125 is 0 if the current iteration count satisfies a different condition (e.g., is even), or if instantaneous syndrome update is enabled. Moreover, if the current iteration count is even, or if instantaneous syndrome update is enabled, syndrome memory 1190 is write enabled through input 1191. In contrast, syndrome memory 1192 is write enabled through input 1193 if the current iteration count is odd, and is not used if instantaneous syndrome update is enabled. With instantaneous syndrome updating, syndrome values are provided from syndrome memory 1190 into the compare/flip logic 1170 as the syndrome values are updated in real time. In contrast, without instantaneous syndrome updating, syndrome memories 1190 and 1192 alternate in storing the updated syndrome values, based on syndromes computed from the last iteration and stored in the other memory. A selection of whether to operate in a mode that uses instantaneous syndrome updating or not is selected through the MUX 1175, where each of inputs 1176 and 1177 represents a different mode of syndrome updating.

At each iteration, compare/flip logic 1170 compares the threshold set input 1124 to the number of the unsatisfied check nodes, and the current hard decision of a variable bit is flipped if the number of unsatisfied checks that are connected to the variable node or are associated with the variable node is greater than the threshold set input 1124. Different threshold values 1121 and 1122 may be used, depending on the reliability of the variable bit. The threshold corresponding to a reliability of 1 may be different from the threshold corresponding to a reliability of 0.

At the end of each iteration, after syndrome values are updated, convergence monitor 1160 determines if one or more convergence or termination conditions have been satisfied, where input 1161 may be a maximum iteration count, and a codeword convergence flag 1162 may be set to a predetermined value if an all-zero syndrome is achieved, or if the maximum iteration count 1161 has been reached.

Architecture 1200 is similar to architecture 1100, except that in architecture 1200, a reliability update table lookup 1240 is included to update variable reliability information stored in MEM2 1210. Control signal 1248 to MUX 1245 is 0 only if two-bit input decoding is enabled. Elements in architecture 1200 that share the same last two digits as elements in architecture 1100 are equivalent.

Figure 13:
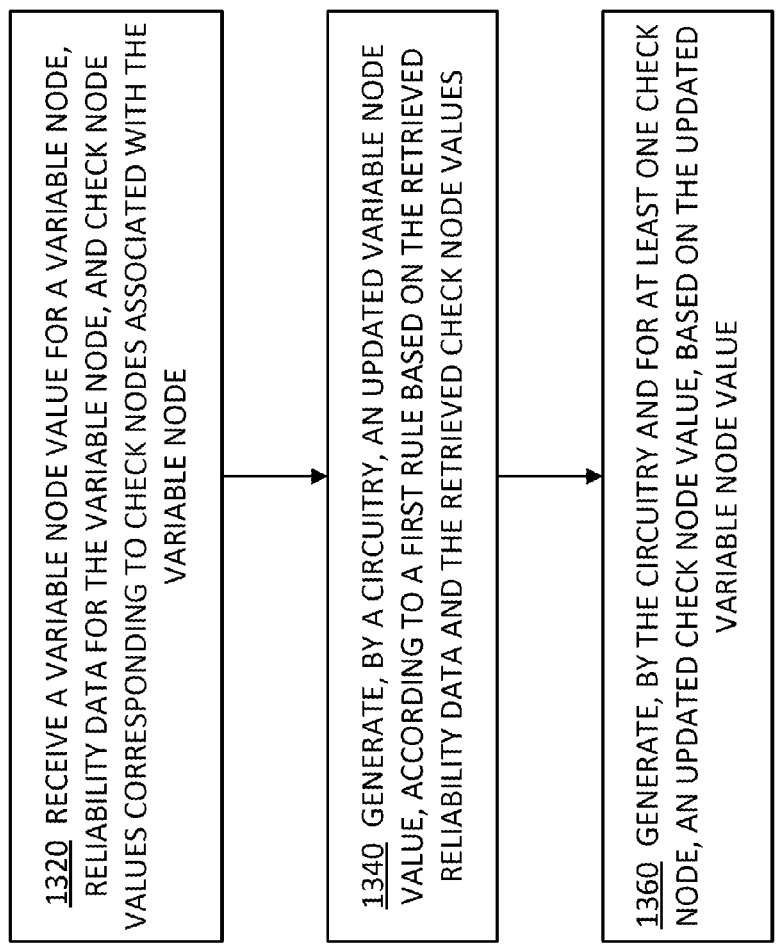
FIG. 13 is a flow chart of an illustrative process for LDPC decoding based on variable node reliability data, in accordance with an embodiment of the present disclosure.

FIG. 13 shows a high level flow chart for a process 1300 for LDPC decoding based on variable node reliability data, in accordance with an embodiment of the present disclosure. A decoding system similar to any of systems 400, 600, 800, or 900 may execute process 1300 by receiving a variable node value and reliability data for a variable node, and check node values corresponding to check nodes associated with the variable node (1320). In an example, the variable node value may be retrieved from a memory unit and the reliability data may be retrieved from the same memory unit or a different memory unit.

The decoding system includes circuitry configured to generate an updated variable node value, according to a first rule based on the retrieved reliability data and the retrieved check node values (1340). In some embodiments, the first rule is based on a number of check nodes associated with the variable node that have a given received check node value. In particular, the first rule may be based on whether the number of check nodes that have the given received check node value exceeds some predetermined threshold. In some embodiments, generating the updated variable node value according to the first rule includes using a lookup table, such as those shown and described in relation to FIG. 3. In some embodiments, when the updated variable node value is different from a previous value of the variable node value, the updated variable node value is stored in memory.

The circuitry of the decoding system also generates for at least one check node, an updated check node value, based on the updated variable node value (1360). In some embodiments, generating the updated check node value for at least one check node is in response to determining that the updated variable node value is different from a previous value of the variable node value. In some embodiments, updated reliability data for the variable node is generated, according to a second rule based on the received reliability data and received check node values. In particular, the second rule is based on the number of check nodes having the given received check node value. In some embodiments, check reliability data for check nodes associated with the variable node is received, and the first rule is further based on the received check reliability data. The check reliability data for at least one check node may be processed, according to a third rule based on the received reliability data, the received check node values, and the received check reliability data.

While various embodiments of the present disclosure have been shown and described herein, it will be obvious to those skilled in the art that such embodiments are provided by way of example only. Numerous variations, changes, and substitutions will now occur to those skilled in the art without departing from the disclosure. It should be understood that various alternatives to the embodiments of the disclosure described herein may be employed in practicing the disclosure. It is intended that the following claims define the scope of the disclosure and that methods and structures within the scope of these claims and their equivalents be covered thereby.

What is claimed is:

1. A method for decoding data, comprising:
receiving a variable node value and reliability data for a variable node, and check node values for check nodes associated with the variable node, wherein the check nodes include a number of check nodes that have a first check node value;

selecting, from a lookup table listing a plurality of functions, a function that takes as inputs the reliability data and the number of check nodes;

generating, by a circuitry, an updated variable node value, by executing the selected function, wherein the selected function comprises determining whether the number of check nodes exceeds a predetermined threshold; and generating, by the circuitry and for at least one check node, an updated check node value based on the updated variable node value.

2. The method of claim 1, further comprising determining whether updated check node values for the at least one check node satisfy a decoding convergence condition.

3. The method of claim 1, wherein the lookup table is a first lookup table, and wherein the selecting from the first lookup table comprises:

determining a respective number of check nodes that have each of a plurality of check node values to generate a tuple;

retrieving an index corresponding to the tuple from a second lookup table; and selecting the function from the first lookup table based on the index.

4. The method of claim 1, further comprising:

in response to determining that the updated variable node value is different from a previous value of the variable node value, storing the updated variable node value in memory.

5. The method of claim 1, wherein generating the updated check node value for at least one check node is in response to determining that the updated variable node value is different from a previous value of the variable node value.

6. The method of claim 1, wherein the selected function is a first function, and further comprising generating, by the circuitry, updated reliability data for the variable node, according to a second function based on the received reliability data and received check node values.

7. The method of claim 6, wherein the second function is based on the number of check nodes having the first check node value.

8. The method of claim 1, wherein the selected function is a first function, and further comprising:

receiving check reliability data for the check nodes associated with the variable node, wherein the first function is further based on the received check reliability data; and processing, by the circuitry and for at least one check node, check reliability data for the check node, according to a second function based on the received reliability data, the received check node values, and the received check reliability data.

9. The method of claim 1, wherein the check nodes in the number of check nodes are unsatisfied check nodes or neighboring check nodes.

10. The method of claim 1, further comprising selecting the predetermined threshold based on the reliability data.

11. A decoder comprising decoding circuitry communicatively coupled to a memory, wherein the decoding circuitry is configured to:

receive a variable node value and reliability data for a variable node, and check node values for check nodes associated with the variable node, wherein the check nodes include a number of check nodes that have a first check node value;

select, from a lookup table listing a plurality of functions, a function that takes as inputs the reliability data and the number of check nodes;

generate an updated variable node value, by executing the selected function, wherein the selected function comprises determining whether the number of check nodes exceeds a predetermined threshold; and generate, for at least one check node, an updated check node value based on the updated variable node value.

12. The decoder of claim 11, wherein the decoding circuitry is further configured to determine whether updated check node values for the at least one check node satisfy a decoding convergence condition.

13. The decoder of claim 11, wherein the lookup table is a first lookup table, and wherein the decoding circuitry configured to select from the first lookup table is further configured to:

determine a respective number of check nodes that have each of a plurality of check node values to generate a tuple;

retrieve an index corresponding to the tuple from a second lookup table; and select the function from the first lookup table based on the index.

14. The decoder of claim 11, wherein the decoding circuitry is further configured to store the updated variable node in memory in response to determining that the updated variable node value is different from a previous value of the variable node value, storing the updated variable node value in memory.

15. The decoder of claim 11, wherein the decoding circuitry generates the updated check node value for at least one check node in response to determining that the updated variable node value is different from a previous value of the variable node value.

16. The decoder of claim 11, wherein the selected function is a first function, and wherein the decoding circuitry is further configured to generate updated reliability data for the variable node, according to a second function based on the received reliability data and received check node values.

17. The decoder of claim 16, wherein the second function is based on the number of check nodes having the first check node value.

18. The decoder of claim 11, wherein the selected function is a first function, and wherein the decoding circuitry is further configured to:

receive check reliability data for the check nodes associated with the variable node, wherein the first function is further based on the received check reliability data; and process, for at least one check node, check reliability data for the check node, according to a second function based on the received reliability data, the received check node values, and the received check reliability data.

19. The decoder of claim 11, wherein the check nodes in the number of check nodes are unsatisfied check nodes or neighboring check nodes.

20. The decoder of claim 11, wherein the decoder is further configured to select the predetermined threshold based on the reliability data.

* * * * *